United States Patent
Wessel et al.

(10) Patent No.: US 6,275,685 B1
(45) Date of Patent: Aug. 14, 2001

(54) LINEAR AMPLIFIER ARRANGEMENT

(75) Inventors: David N Wessel, Woodlawn (CA); John D McNicol, Vaucresson (FR); Howard J Smith, Bishop's Stortford (GB)

(73) Assignee: Nortel Networks Limited, Montreal, Quebec (CA)

( * ) Notice: Subject to any disclaimer, the term of this patent is extended or adjusted under 35 U.S.C. 154(b) by 0 days.

(21) Appl. No.: 09/209,386

(22) Filed: Dec. 10, 1998

(51) Int. Cl.[7] .................................................. H01Q 11/12
(52) U.S. Cl. ........................... 455/126; 455/63; 330/149; 375/296
(58) Field of Search ................ 455/126, 63, 501, 455/75, 119, 108, 561, 127, 67.3; 330/149, 151; 375/346, 296; 332/159–162

(56) References Cited

U.S. PATENT DOCUMENTS

| | | |
|---|---|---|
| 4,700,151 | 10/1987 | Nagata . |
| 5,049,832 | 9/1991 | Cavers . |
| 5,193,224 | 3/1993 | McNicol . |
| 5,699,383 * | 12/1997 | Ichiyoshi ............................. 455/126 |
| 5,742,201 * | 4/1998 | Eisenberg et al. ................. 330/149 |
| 5,770,971 | 6/1998 | McNicol . |
| 5,903,611 * | 5/1999 | Schnabl et al. ..................... 455/126 |
| 5,959,499 * | 9/1999 | Khan et al. ......................... 455/126 |

* cited by examiner

*Primary Examiner*—Doris H. To
(74) *Attorney, Agent, or Firm*—Lee, Mann, Smith, McWilliams, Sweeney & Ohlson

(57) ABSTRACT

This invention relates to high power linear amplifiers. A high power linear amplifier is disclosed for communications such as CDMA communication systems. In accordance with the invention, there is provided a power amplifier comprising a power amplifier, a feedback circuit and a control element; wherein the architecture proposed uses an envelope detector to generate a baseband signal representing the amplitude envelope of the system input RF signal. This is digitised and used to generate phase and gain correction signals. The correction signals modulate the input signal to create a pre-distorted signal: which is applied to the power amplifier for amplification. The pre-distortion is such as to cancel the AM-AM and AM-PM distortion of the power amplifier thus resulting in an amplified output of improved spectral purity. In order to achieve the very high levels of spectral purity required by 3G cellular and multi-carrier 2G cellular systems, the correction coefficients in the lookup table need to be very precisely set. The method proposed incorporates an adaptation system whereby the pre-distorter can 'learn' the contents of the lookup table as it operates.

23 Claims, 7 Drawing Sheets

LINEAR AMPLIFIER ARRANGEMENT

FIELD OF THE INVENTION

This invention relates to high power linear amplifiers and in particular relates to the same using digital pre-distortion.

BACKGROUND OF THE INVENTION

First and second generation cellular systems have historically used forms of modulation which are either constant envelope (e.g. GMSK in GSM) or which result in relatively low levels of amplitude modulation. The linearity of the high power amplifiers used for such systems has therefore not been an important technical issue; indeed, for the constant envelope systems it is standard practice to operate the amplifiers either close to or actually in compression in order to maximise power efficiency.

Third generation cellular systems however typically use linear spread-spectrum modulation schemes with a large amount of amplitude modulation on the signal envelope. When passed through a high power amplifier, the output is typically distorted in amplitude and phase by the non-linearity of the amplifier: the amplitude and phase distortion effects are commonly referred to as AM-AM conversion and AM-PM conversion respectively. Both distortion effects are a function only of the amplitude envelope of the input signal and are insensitive to the input phase envelope.

In systems such as Code Division Multiple Access (CDMA) modulation schemes, a plurality of signals are transmitted in a communication system and are amplified simultaneously. When a plurality of signals are applied to a linear amplifier, its non-linear characteristics will tend to produce interaction between the signals being amplified and the amplifier output will contain intermodulation products. Such intermodulation products reduce signal quality by allowing cross-talk to occur and such spillage often falls outside a particular licensed spectrum and must be controlled. Such intermodulation distortion can be reduced by negative feedback of the distortion components, pre-distortion of the signal to be amplified to cancel the amplifier generated distortion, or by separating the distortion components with the amplifier output and feeding forward the distortion component to cancel the distortion of the amplifier output signal.

There are many ways of linearising a high power amplifier: direct RF feedback, envelope feedback, feed-forward and pre-distortion. For cellular power amplifiers, feed-forward amplifiers are commonly used. Feed forward amplifiers are more complicated in that they require the modification of the separated distortion component in amplitude and phase to match the gain and phase shift of the amplifier on a continuous basis and require an error amplifier which is typically similar in power handling to the main amplifier: this incurs a heavy penalty in RF device cost and power efficiency.

Envelope feedback methods (polar and Cartesian) perform much better than feed-forward amplifiers in terms of device cost and efficiency since the RF signal linearisation processing is done before the power amplifier on a small signal. However, envelope feedback is fundamentally limited in the correction bandwidth obtainable by the delay of the feedback loop. As systems migrate to wider band modulation (e.g. CDMA2000 and WCDMA) a linearisation technology is required which is fundamentally a wideband technique.

Most implementations of pre-distortion are inherently wideband, however the performance achievable has been limited by the difficulty of matching the complex distortion characteristics of typical power amplifier devices with simple analogue pre-distortion networks.

U.S. Pat. No. 4,700,151 (Nagata) provides a baseband (analogue or digital) modulation system and technique which employs a look-up table for adaptation. U.S. Pat. No. 5,049,832 (Cavers) provides a digital pre-distortion arrangement which reduces memory requirements to under 100 complex pairs, with a resultant reduction in convergence time and removes the need for a phase shifter or PLL in a feedback path.

OBJECT OF THE INVENTION

The present invention seeks to provide an improved linear amplifier arrangement which achieves correction over a wide bandwidth with lower system cost and higher efficiency than known techniques. More particularly the present invention seeks to provide a linear amplifier arrangement capable of amplifying and combining a number of frequency carriers or bearers.

SUMMARY OF THE INVENTION

In accordance with a first aspect of the invention, there is provided a linear power amplifier arrangement comprising a high power amplifier, a pre-distortion circuit and a feedback circuit; wherein an input is operable to receive radio frequency RF input signals to the arrangement and is connected to the power amplifier; wherein the feedback circuit compares a sample of the power amplifier signal output with a sample of the input signal to provide error signals, which error signals are employed to modify a set of look-up values; wherein the pre-distortion circuit receives a sample of the RF input signal and gain and phase error signals from the feedback circuit; and wherein the pre-distortion circuit determines gain and phase error correction signals relative to the set of look-up values and the sample of the RF input signal, which gain and phase error correction signals are applied to inputs of RF amplitude and phase modulators; which error correction signals are generated as functions of the RF input signal in such a way that the modulated delayed RF input signal on passing through the high power amplifier emerges with reduced distortion.

In accordance with a second aspect of the invention, there is provided a linear power amplifier arrangement comprising a high power amplifier, a pre-distortion circuit and a feedback circuit; wherein a radio frequency (RF) input is operable to receive RF input signals and is connected to the power amplifier via a directional coupler, a first delay line, an RF amplitude modulator and an RF phase modulator; wherein the feedback circuit comprises a directional coupler operable to sample an output of the amplifier and provide a signal to an amplitude and phase error detector; wherein the pre-distortion circuit comprises a coupled line from the input directional coupler, a power splitter, the outputs of which are connected to a second delay line and an adaptive pre-distortion subsystem; wherein the second delay line is operable to provide a signal to the amplitude and phase error detector; and wherein the pre-distorter subsystem is operable to receive signals from the power splitter via an RF envelope detector and signals relating to gain error and amplitude error from the phase and amplitude error detector and to provide a gain correction signal to a control port of the amplitude modulator; and a phase correction signal to a control port of the phase modulator. The adaptive pre-distorter is therefore capable of generating the correction signals as functions of a tapped RF input signal in such a way that the modulated delayed RF input signal, on passing through the high power amplifier, emerges with reduced distortion.

In order to compensate for changes in the high power amplifier gain and phase distortion characteristic, for example due to temperature or channel frequency changes the pre-distorter operates on an adaptive basis. That is, the pre-distorter adaptively adjusts its gain and phase transfer functions in response to residual gain error and residual phase error signals fed back from an error detection sub-system.

The first delay line is operable to compensate for any delay skew between the signal modulation and the correction signals induced by processing delay in the correction path and the output is delivered as the amplified signal. The architecture proposed provides a method of pre-distorting the input signal to a power amplifier such that the AM-AM and AM-PM distortion generated by the power amplifier is cancelled, producing an output signal with reduced spectral regrowth in adjacent channels.

In accordance with a third aspect of the invention, there is provided a linear power amplifier arrangement comprising a high power amplifier, a pre-distortion circuit and a feedback circuit; wherein an input is operable to receive radio frequency (RF) input signals and is connected to the power amplifier via a directional coupler, a first delay line, a first RF amplitude modulator, a first RF phase modulator, a second RF amplitude modulator and a RF second phase modulator; wherein the feedback circuit comprises a directional coupler operable to sample an output of the amplifier and provide a signal to an amplitude and phase error detector; baseband processing elements; and second amplitude and phase modulators; wherein the pre-distortion circuit comprises a coupled line from the input directional coupler, a power splitter, the outputs of which are connected to a second delay line and an adaptive pre-distortion sub-system; wherein the second delay line is operable to provide a signal to the amplitude and phase error detector; and wherein the pre-distorter subsystem is operable to receive signals from the power splitter via an RF envelope detector and signals relating to gain error and amplitude error from the phase and amplitude error detector and to provide a gain correction signal to a control port of the first amplitude modulator; and a phase correction signal to a control port of the first phase modulator. The adaptive pre-distorter is therefore capable of generating the correction signals as functions of a tapped RF input signal in such a way that the modulated delayed RF input signal, on passing through the high power amplifier, emerges with reduced distortion.

In this third embodiment, the architecture incorporates a 'slow feedback' control system which nulls out the average gain and phase errors in the adaptation loop.

The baseband processing elements are feedback loops operable in the gain and phase domains in order to centre the operation of the pre-distorter and allow system components of greatly reduced operating range to be used. Preferably the amplifier arrangement further comprises, in the pre-distortion sub-circuit: an input operable to receive a time-varying output proportional to the varying amplitude envelope of the RF input signal from the envelope generator; an anti-alias filter and analogue-to-digital converter (ADC) signal digitiser, a lookup table (LUT) to determine gain and phase correction coefficients; digital-to-analogue converters (DACs) and anti-alias filters operable to convert these gain and phase correction coefficients to the analogue domain; whereby the sub-circuit can produce continuous-time correction signals.

The architecture provides a method whereby the LUT adaptively 'learns' the pre-distortion coefficients required. The input signal is delayed and the output signal attenuated so that the sampled signals are equal in power and any skew in the modulation envelope is resolved. Such delay and attenuation may be intrinsically associated with the circuitry, but it is preferable that dedicated circuit components are provided whereby the power and skew between the input signal at the gain and phase detector may be controlled.

In accordance with a further aspect of the invention, there is provided a method of operating a linear power amplifier arrangement comprising a high power amplifier, a pre-distortion circuit and a feedback circuit; comprising the following steps: receiving RF input signals at an input connected to the power amplifier via a directional coupler, a first delay line, an RF amplitude modulator and an RF phase modulator; in the feedback circuit: coupling output signals from an output of the amplifier employing a directional coupler operable to sample an output of the amplifier and to provide signals to an amplitude and phase error detector; in the pre-distortion circuit: coupling a sample of the RF input signal employing a directional coupler, splitting the signal via a power splitter, feeding a first output of which to an amplitude and phase error detector via a second delay line and a second output of which to an adaptive pre-distortion sub-system via an RF envelope detector; at the pre-distorter sub-system: receiving sampled RF input signals from the RF envelope detector and signals relating to gain error and amplitude error from the phase and amplitude error detector and providing a gain correction signal to a control port of the RF amplitude modulator; and a RF phase correction signal to a control port of the phase modulator, wherein the adaptive pre-distorter is operable to generate the correction signals as functions of a tapped RF input signal in such a way that the modulated delayed RF input signal on passing through the high power amplifier emerges with reduced distortion.

A preferred fashion of determining the correction signals in the above described embodiments of the above amplifier arrangements, comprises in the pre-distortion sub-circuit, the following steps: receiving a time-varying output proportional to the varying amplitude envelope of the RF input signal from the envelope generator; digitising this signal by an anti-alias filter and analogue-to-digital converter (ADC), determining gain and phase correction coefficients in a lookup table (LUT); converting these gain and phase correction coefficients to the analogue domain by digital-to-analogue converters (DACs) and anti-alias filters; whereby to produce continuous-time correction signals. The gain correction signal modifies a delayed copy of the RF input signal via an amplitude modulator and the phase correction signal modifies the result by a phase modulator. Preferably the LUT is typically a random access memory, as are widely known.

In accordance with a still further aspect of the invention, there is provided a method of operating a linear power amplifier arrangement comprising a high power amplifier, a pre-distortion circuit and a feedback circuit; comprising the following steps: receiving input signals at an input connected to the power amplifier via a directional coupler, a first delay line, a first amplitude modulator, a first phase modulator, a second amplitude modulator and a second phase modulator; in the feedback circuit: coupling output signals from an output of the amplifier employing a directional coupler operable to sample an output of the amplifier and to provide signals to an amplitude and phase error detector and to second amplitude and phase modulators via baseband processing elements which baseband processing elements comprise feedback loops operable in the gain and phase domains and which centre the operation of the pre-distorter; in the pre-distortion circuit: coupling a sample of the input signal employing a directional coupler, splitting the signal via a power splitter, feeding a first output of which to an amplitude and phase error detector via a second delay line and a second output of which to an adaptive pre-distortion sub-system via an envelope detector; at the pre-distorter sub-system: receiving sampled input signals from the envelope detector and signals relating to gain error and amplitude error from the phase and amplitude error detector and providing a gain correction signal to a control port of the first amplitude modulator; and a phase correction signal to a control port of the first phase modulator, wherein the adaptive pre-distorter is operable to generate the correction signals as functions of a tapped input signal in such a way that the modulated delayed input signal on passing through the high power amplifier emerges with reduced distortion.

In accordance with a yet further embodiment, there is provided a cellular radio base station incorporating the amplifier arrangement.

BRIEF DESCRIPTION OF THE DRAWINGS

In order that the present invention can be more fully understood and to show how the same may be carried into effect, reference shall now be made, by way of example only, to the figures as shown in the accompanying drawing sheets wherein.

DETAILED DESCRIPTION OF THE PREFERRED EMBODIMENTS

There will now be described by way of example the best mode contemplated by the inventors for carrying out the invention. In the following description, numerous specific details are set out in order to provide a complete understanding of the present invention. It will be apparent, however, to those skilled in the art that the present invention may be put into practice with variations of the specific.

Figure 1A:
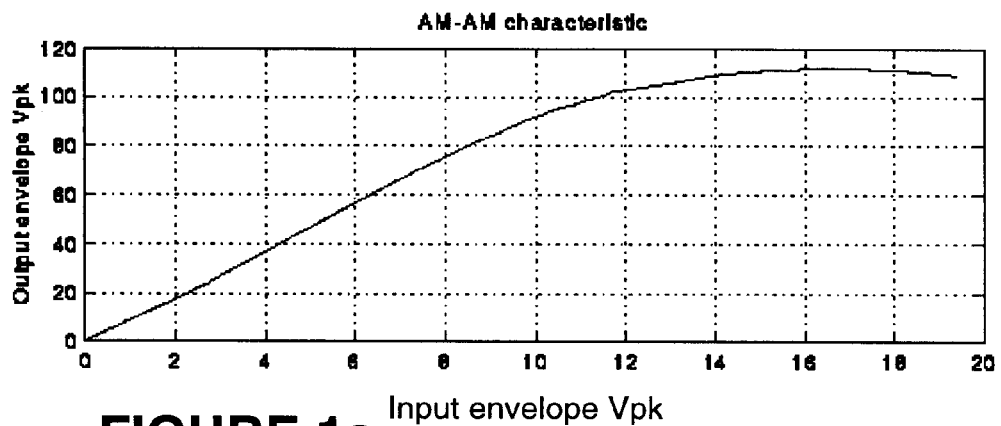
FIGS. 1a–d show graphs relating to amplifier performance.
Figure 1B:
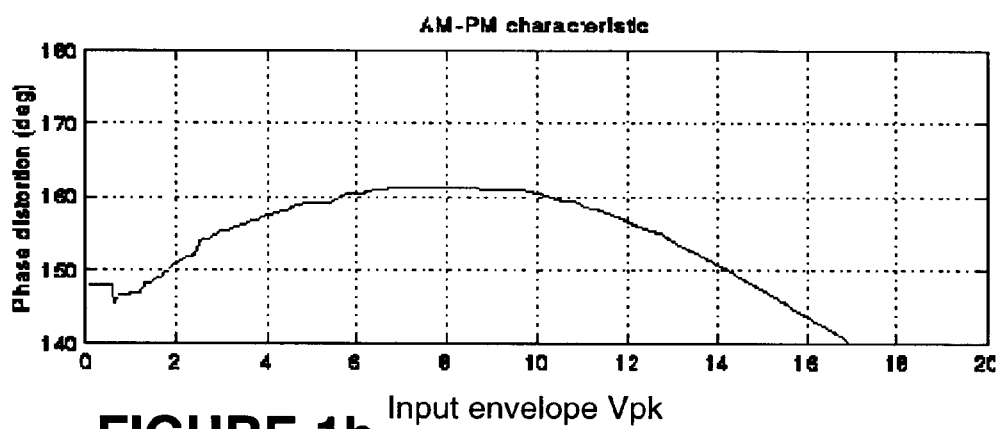

FIGS. 1a and 1b show the amplitude and phase distortion characteristics of a typical class AB power amplifier. FIG. 1a gives the output signal envelope in volts as a function of the input signal envelope in volts, showing the characteristic amplitude compression as the amplifiers nears its saturated output power. FIG. 1b gives the phase shift through the high power amplifier as a function of the input signal amplitude envelope.

Figure 1C:
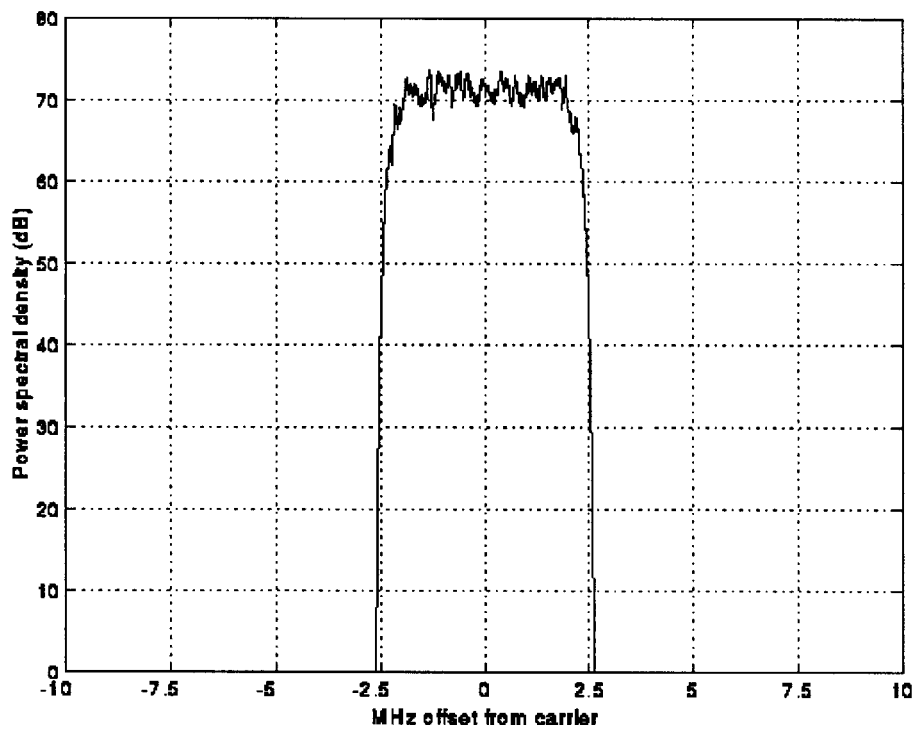
Figure 1D:
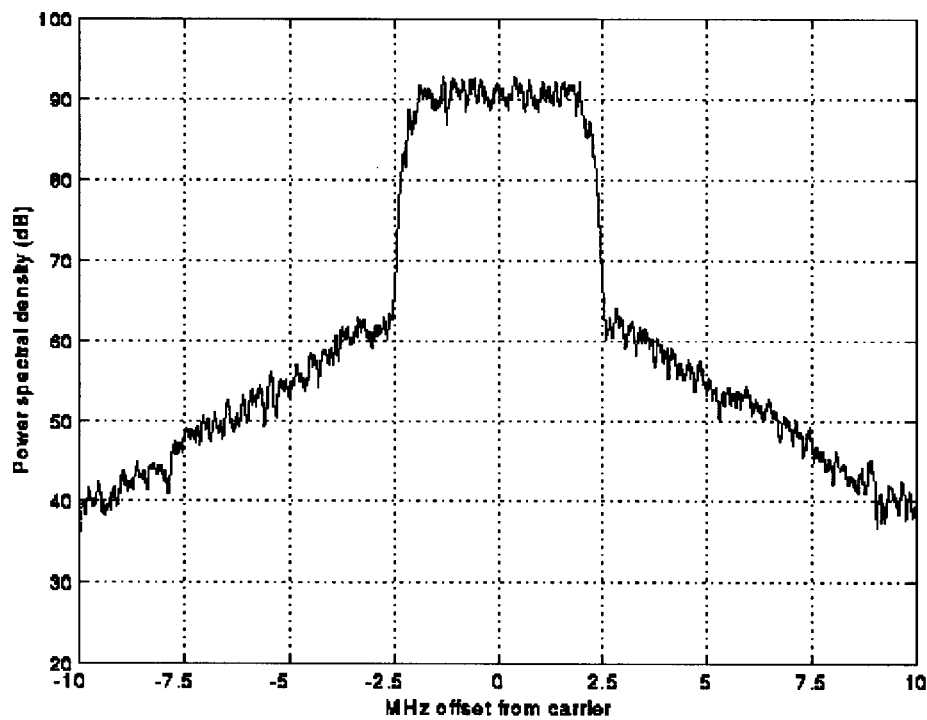

The effect of amplifier distortion on a spread-spectrum modulated signal is illustrated in FIGS. 1c and 1d. FIG. 1c shows the power spectrum of a 20 channel QPSK signal applied to the power amplifier input, whilst FIG. 1d shows the resulting power spectrum at the amplifier output. The spectrum has developed sidebands, termed 'regrowth sidebands' which are characteristic of amplifier distortion. Regrowth sidebands are a system problem since they can potentially interfere with neighbouring communication channels. Specification limits on regrowth sidebands are therefore stringently specified in most cellular communication standards.

Figure 2:
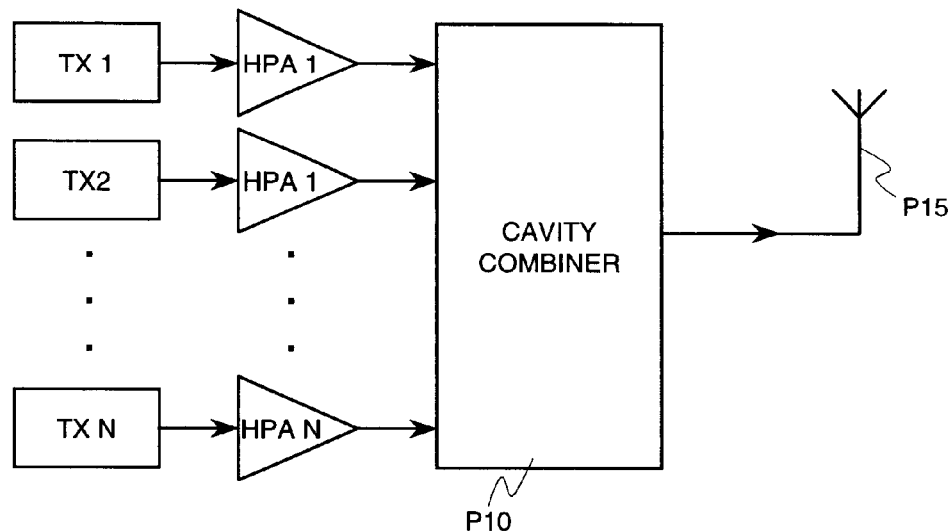
FIG. 2 shows a first known amplifier arrangement.

FIG. 2 shows a conventional cavity combiner transmitter system. A plurality of separate transmitters TX1, TX2 . . . TXM each generate a signal which occupies a particular radio frequency band which is then amplified by respective high power amplifier HPA1, HPA2, . . . HPAN. The set of N such amplified signals are combined by a cavity combiner P10 for feeding to an antenna P15. A disadvantage of this is the expensive cavity combiner which typically needs to be adjustable in order to combine the power amplifiers with low loss, and maintain this low loss even in the event of an amplifier failure.

Figure 3:
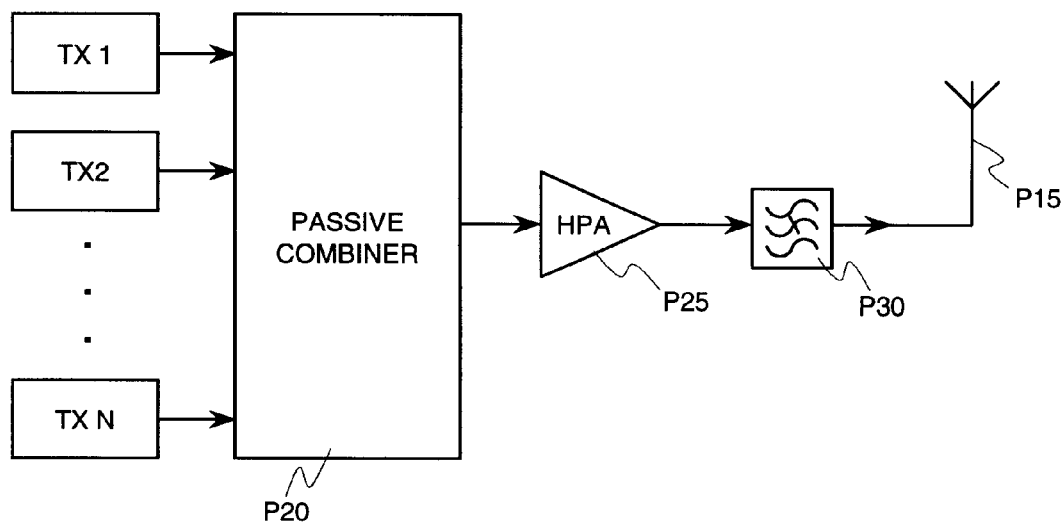
FIG. 3 shows a second known amplifier arrangement.

FIG. 3 shows an alternative transmitter architecture which is enabled by use of a linearised amplifier such as described in this document. Multiple transmitters on various channel frequencies are combined at a low signal level by a passive combiner (P20). In contrast to the cavity combiner (P10) described previously, the passive combiner (P20) does not need to be low loss and can therefore be an inexpensive hybrid type. Such a passive combiner also maintains high isolation between its input ports in the event of a fault on one of its inputs. The combined output, being a composite of modulated signals at different channel frequencies, is then applied to a linearised high power amplifier (P25) such as that described in this document. Due to the improved linearity performance of the amplifier, the multi-carrier signal is amplified without generating unacceptable intermodulation products and is radiated from antenna (P15) via a low cost, low loss band filter (P30).

Figure 4:
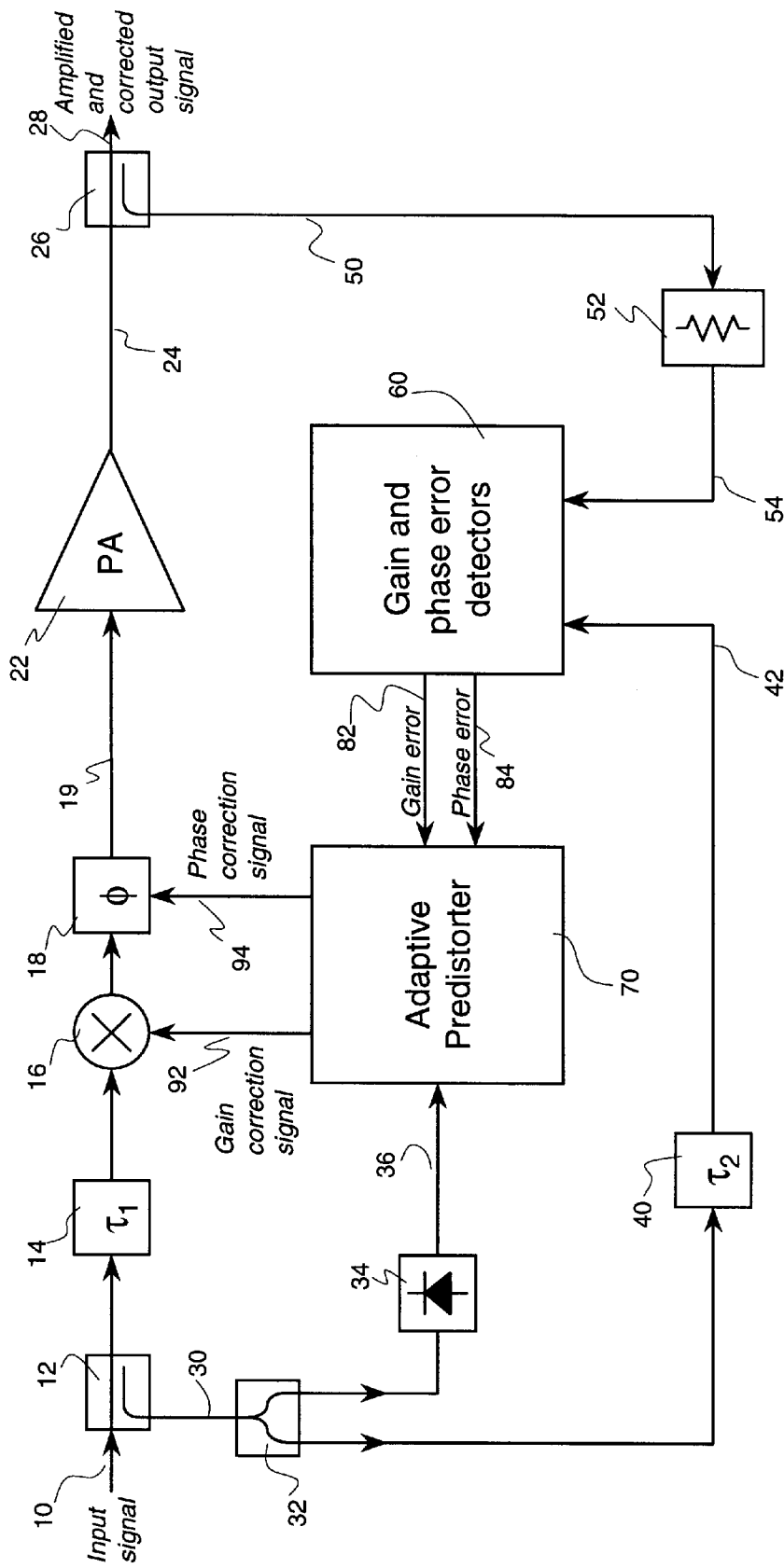
FIG. 4 shows an amplifier arrangement in accordance with a first embodiment of the invention.

FIG. 4 shows a block diagram of a first embodiment made in accordance with the invention. In use, an RF input signal (10) is applied to a high power amplifier (22) via a directional coupler (12), a first delay line (14), an amplitude modulator (16) and a phase modulator (18). An output of the amplifier (22) provides an amplified output signal (28) which is sampled by a directional coupler (26). The sampled RF output from the directional coupler (12) is applied to a power splitter (32), the outputs of which are connected to an envelope detector (34) and a second delay line (40). The output of the envelope detector is connected to an adaptive pre-distorter subsystem (70). The adaptive pre-distorter subsystem (70) generates two outputs: a gain correction signal (92) which is connected to the control port of first amplitude modulator (16); and a phase correction signal (94) which is connected to the control port of phase modulator (18).

The adaptive pre-distorter (70) generates the correction signals (92, 94) as functions of input (36) in such a way that the input signal, delayed by (14) anrd modulated by modulators (16, 18), on passing through the high power amplifier (22) emerges with lower distortion than if no pre-distortion subsystem had been employed. The purpose of the pre-distorter gain and phase transfer functions is therefore to cancel the gain and phase distortion produced in the power amplifier (22). The purpose of delay line (14) is to compensate for any delay skew between the signal (10) modulation and the correction signals (92, 94) induced by processing delay in the correction path (12, 32, 34, 70).

The error detection subsystem (60) requires as inputs a sample (42) of the input signal (10) and a sample (54) of the output signal (28), normalised to the same signal level and aligned in time. Output sample (54) is normalised to the same level as (42) by attenuating the coupled output of coupler (26) in attenuator (52); input sample (42) is time-aligned with (54) by delaying one output of power splitter (32) in delay line (40).

In order to compensate for changes in the high power amplifier (22) gain and phase distortion characteristic, for example due to temperature or channel frequency changes the pre-distorter (70) operates on an adaptive basis. That is, the pre-distorter (70) adaptively adjusts its gain and phase transfer functions in response to residual gain error (82) and residual phase error (84) signals fed back from an error detection subsystem (60). The pre-distortion functions therefore optimally converge as the system operates.

Figure 5:
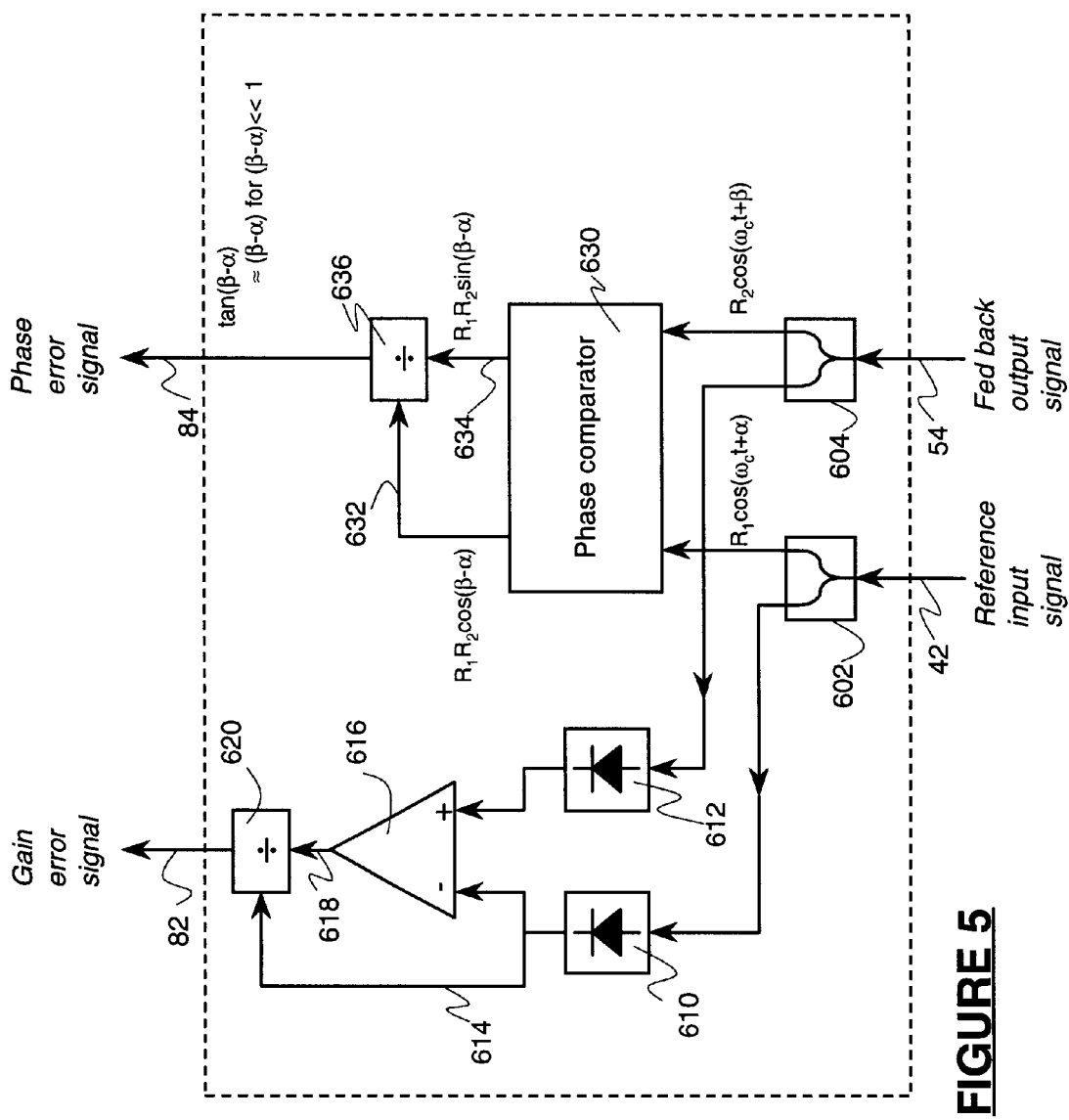
FIG. 5 shows in detail a gain and phase error detector.

FIG. 5 shows an implementation of error detection subsystem (60) as may be used in the above described amplifier. The input signals (42) and (54) are each split by power splitters (602) and (604) respectively. An output of splitter (602) is fed to envelope detector (610) and an output of splitter (604) is fed to envelope detector (612). The envelope detectors (610, 612) produce output voltages proportional to the amplitude envelope of signals (42) and (54) respectively. The output voltage of detector (610) is subtracted from the output of detector (612) by a differential amplifier (616) to produce a signal (618) proportional to the amplitude error between (42) and (54). The difference signal (618) is divided in analogue divider block (620) by signal (614) being the output of envelope detector (610) to produce a signal (82) which is proportional to the gain error between (42) and (54). The implication of this is that the gain error signal (82) is a metric (only of the gain distortion (amplitude compression or expansion) in the power amplifier and is independent of the input signal envelope level. This can improve the stability of the amplitude adaptation loop allowing parameter $\mu_g$ to be set more closely for rapid conversions.

The remaining outputs of splitters (602) and (604) are fed to a phase comparator (630) which has two outputs (632) and (634). If the RF input from splitter (602) is represented in polar form by $R_1.\cos(\omega_c t+\alpha)$ and the RF input from splitter (604) is represented by $R_2.\cos(\omega_c t+\beta)$ then the response of phase comparator (630) is such that output (632) is proportional to $R_1.R_2.\cos(\beta-\alpha)$ and output (634) is proportional to $R_1.R_2.\sin(\beta-\alpha)$. Analogue divider block (636) divides output (634) by (632) to give phase error signal (84): it should be noted that this divider is merely correcting for the amplitude response of the differential phase detector and hence performs a different role to that (620) in the gain error loop. Phase error signal (84) is then equal to $\tan(\beta-\alpha)$ which for $(\beta-\alpha)$ small is approximately proportional to $(\beta-\alpha)$.

Variations of the error detector (60) are possible. Depending on the performance required, the amplitude analogue divider (620) may be omitted (although $\mu_g$ will need to be set to a lower value in order to preserve a loop stability), an alternative configuration of amplitude detectors and signal processing elements may be used. Alternative types of phase discriminator may also be used. A variation of the error detector (60) may be implemented which generates error signals (82, 84) relating to the signs of the amplitude and phase errors only, as are commonly employed elsewhere in the field of control systems.

The error detection block (60) may be partially or entirely replaced by digital implementation, wherein the RF signals (42, 54) are digitised and the error signals (82, 84) are computed by digital signal processing means (DSP). The feeding of these error signals to gain blocks (724, 754) into the predistorter (70) can then be performed in the digital domain.

Figure 6:
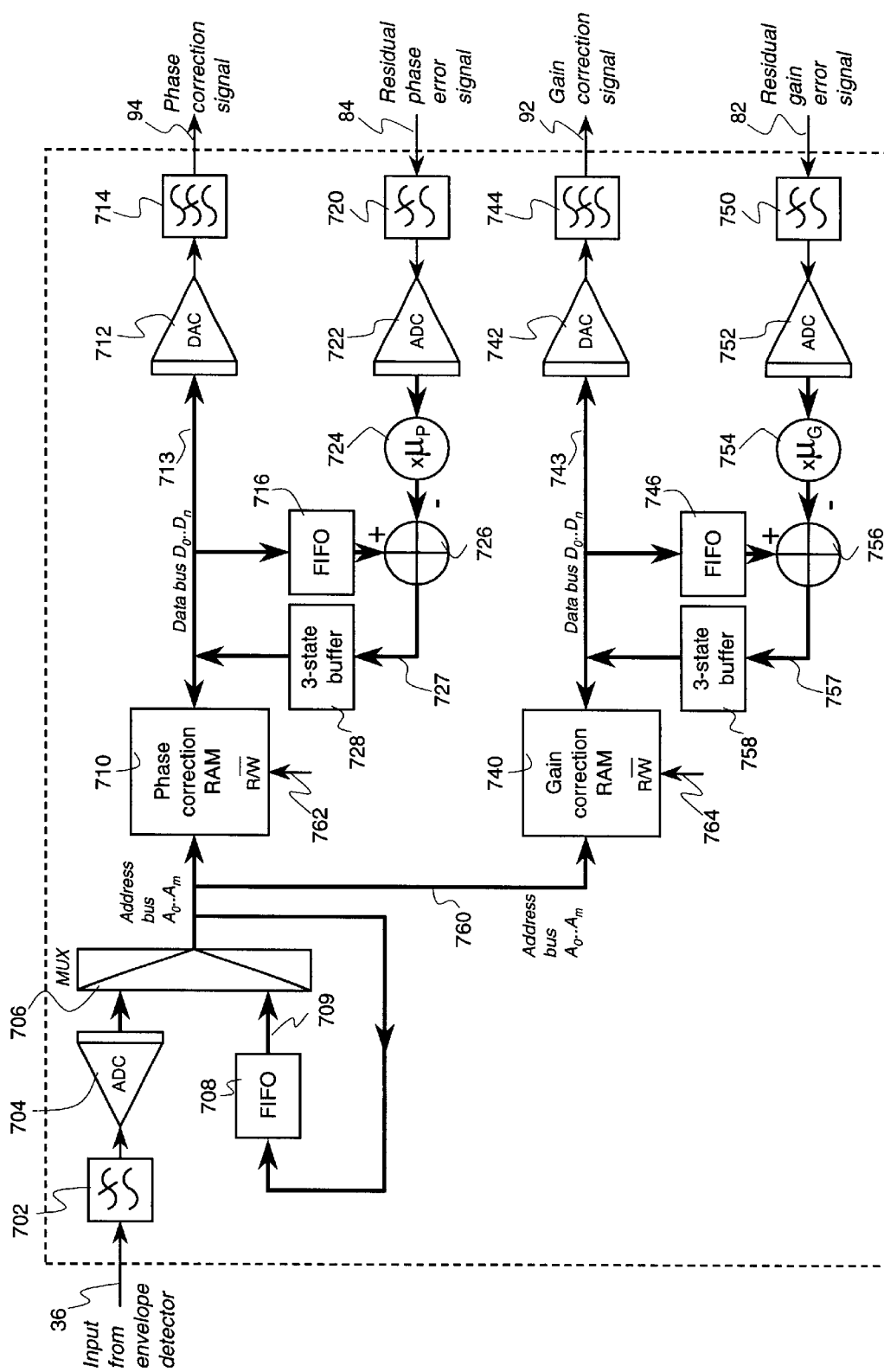
FIG. 6 shows in detail the pre-distortion sub-system.

FIG. 6 shows an implementation of the adaptive digital pre-distorter (70). Signal (36), being proportional to the amplitude envelope of the system input (10) is filtered by a low-pass anti-alias filter (702) and is digitised by (704), an analogue-to-digital converter. The m-bit output of the ADC is connected to the m bits of an address bus (760) via a multiplexer (706). The address bus (760) is used to select an address in RAM (710) a $2^m$ word phase correction random access memory (RAM) and (740), a $2_m$ word gain correction RAM.

The data bus (713) of phase correction RAM (710) is connected to (712), a latching digital-to-analogue converter (DAC). The output of the DAC (712) is filtered by a low-pass anti-alias filter (714) to give phase correction signal (94). In a similar arrangement, the data bus (743) of gain correction RAM (740) is connected to latching DAC (742). The output of DAC (742) is filtered by low-pass anti-alias filter (744) to give gain correction signal (92).

A two phase clocking scheme is implemented. On phase one of the clock, the ADC (704) samples the filtered input signal (36) and asserts the digital result on address bus (760) via multiplexer (706) which is open for this path on phase one of the clock. In response to the input address and with the read-write input on the RAM(762) being set to 'read', phase correction RAM (710) asserts a correction value on its data bus (713) which is converted to an analogue phase correction signal (94) via DAC (712) and filter (714), which in the first embodiment is low-pass and band-pass in the second embodiment, as will become apparent. Similarly, gain correction RAM (740) asserts a correction value on its data bus (743) which is converted to an analogue gain correction signal (92) via DAC (742) and filter (744). In this way the gain and phase correction signals required by the system are generated during clock phase one.

To facilitate adaptation, the contents of address bus (760), phase RAM data bus (713) and gain RAM data bus (743) are clocked into first-in-first-out (FIFO) buffers (708), (716) and (746) respectively on phase one of the clock. The length of these buffers is adjusted so as to time align the three FIFO-stored signals with the delay on the residual gain and phase error signals (82) and (84), which are delayed by analogue delays in the rest of the system.

On phase two of the clock, the contents of the correction RAMs (710, 740) are set into write mode via their read-write inputs (762, 764) and their contents are adapted. The residual phase error signal (84) is filtered by anti-alias filter (720) and digitised by ADC (722). The result is multiplied by a fixed coefficient $\mu_p$ in (724)and is applied to a subtractor (726). The subtractor forms the difference between the output of FIFO (716) and the output of (724). The resulting digital signal (727) is applied to the phase RAM data bus (713) via a 3-state buffer (728) which passes data on phase two but isolates it on phase one of the clock. in a similar arrangement the residual gain error signal (82) is filtered by anti-alias filter (750) and digitised by ADC (752). The result is multiplied by a fixed coefficient $\mu_g$ in (754) and is applied to a subtractor (756). The subtractor forms the difference between the output of FIFO (746) and the output of (754). The resulting digital signal (757) is applied to the phase RAM data bus (743) via a 3-state buffer (758) which passes data on phase two but isolates it on phase one of the clock. The settings of convergence parameters $\mu_p$ and $\mu_p$ are adjusted to achieve the desired convergence speed whilst maintaining system stability.

The action of adaptation is as follows: on phase two of the clock, multiplexer (706) switches to pass data from FIFO (708) to address bus (760). If the delay in FIFOs (708, 716) and (746) is k cycles of the pre-distorter clock then on clock phase two the address bus (760) is thereby set to select the entries in RAMs (710, 740) corresponding to the signal envelope k clock cycles ago. At the same time, the output of FIFO (716) corresponds to the phase correction value which was used k clock cycles ago. The output of (724) constitutes a metric of the residual phase error left at the same instant (k clock cycles ago) when this phase correction was applied, assuming the FIFO delays have been adjusted correctly. Therefore the output of subtractor (726) represents an improved estimate of the phase correction factor needed for the signal envelope value currently asserted on address bus (760). During phase two of the clock the write enable control of phase correction RAM (710) is strobed, thereby writing the improved estimate (727) into the correct location of the RAM.

Similarly, for adaptation of the gain correction, FIFO (746) yields, on clock phase two, the gain correction factor applied k cycles previously. Subtractor (756) forms an improved estimate of the correction factor needed for the envelope value asserted on address bus (760) by subtracting the scaled residual gain error at the output of (754) from the FIFO (746) output. During phase two of the clock the write enable control of gain correction RAM (740) is strobed, thereby writing the improved estimate (757) into the correct location of the RAM.

Whilst the above figure shows a particular embodiment of the adaptive predistorter (70), those skilled in the art will be able to implement the same functionality in a different arrangement of hardware and/or software.

The architecture provides a method whereby the LUT adaptively 'learns' the pre-distortion coefficients required. The input and output signals of the system are sampled. It is preferable that the input signal is delayed and the output signal attenuated so that the sampled signals are equal in power and any skew in the modulation envelope is resolved. Such delay and attenuation may be intrinsically associated with the circuitry, but it is preferable that dedicated circuit components are provided whereby the power and skew between the input signal at the gain and phase detector may be controlled. The two signals are each split into two: one output being fed into a gain error detector and the other being fed into a phase error detector. The gain error detector produces an output approximately proportional to the gain error between the signals, the phase error detector produces an output approximately proportional to the phase error between the signals. The gain and phase error signals are digitised by an anti-alias filter and ADC. As the pre-distorter operates, the input envelope samples and gain and phase correction samples are delayed in first-in-first-out (FIFO) buffer memory to align them in timing with the sampled error signals from the gain and phase error detectors. The gain and phase error signals are multiplied by a fixed fractional convergence parameter and are subtracted from the delayed gain and phase correction signals respectively to obtain signals which are an improved estimate of what the correction signals at the stored signal envelope should have been. The improved gain and phase correction estimates are written back, sample by sample, into the lookup table using the delayed envelope signal to determine the correct addresses, thereby improving the accuracy of the pre-distortion in future.

The method of adaptation described above modifies one look-up table entry corresponding to one quantised envelope value for each sample of the gain and phase error signals. Hence each entry of the look-up table converges independently of the others. While having a large number of independent table entries has the benefit of being able to adapt to the wider strain of AM-AM and AM-PM functions, it can be disadvantageous with respect to convergence speed and estimation error.

Variations of the algorithm are possible where the use of a single sample of the gain and phase error signals are used to modify multiple adjacent look-up table entries, using a primary knowledge of the properties of the look-up table function, such as limits in the rate of change of amplifier distortion with amplitude that are known for the amplifier employed. As an illustration of the principle, one such variation consists of the steps of: taking an off-line copy of the current gain and phase look-up tables; adapting one or more entries according to the basic algorithm; filtering using a low-pass filter the off-line gain and phase tables with respect to envelope value index; and, writing the modified tables back into the predistorter.

In the event that the gain modulator (16) has sufficient gain adjustment range to absorb all system tolerances as well as all gain compression effects, and the phase modulator (18) has full four-quadrant phase adjustment capability, then the pre-distorter will adapt to track out changes in gain and phase response of the high power amplifier (22) and no further control systems are needed.

The RF modulated input waveform may be represented as $x_c(t)=Re\{x(t)exp(j\omega_c t)\}$, where $x(t)$ is the baseband equivalent complex signal. The proposed architecture performs adaptive pre-distortion of $x_c(t)$ in the polar domain by the following steps:

a) The complex modulus $x_{env}(t)$ of the input signal $x(t)$ is obtained, typically by an envelope detector, viz:

$$x_{env}(t)=|x(t)|$$

b) The envelope signal $x_{env}(t)$ is sampled at rate $f_s$ and quantised to m-bits to yield a sequence of samples $i_k$ where any $i_k$ may take the value $0.2^m-1$.

c) Each $i_k$ is used as an index to select an entry from a $2^m$-entry lookup table (LUT) which stores two output coefficients for each index. One output is a gain correction sample $g_k(i_k)$ and the other is a phase correction sample $P_k(i_k)$.

d) The stream of selected gain correction coefficients $g_k(i_k)$ is converted to a continuous time analogue representation via a digital-to-analogue converter (DAC) to yield gain correction signal $g(t)$.

e) The stream of selected phase correction coefficients $p_k(i_k)$ is converted to a continuous time analogue representation via a digital-to-analogue converter (DAC) to yield phase correction signal $p(t)$.

f) The correction signals $g(t)$ and $p(t)$ are applied to the input signal by appropriate amplitude and phase modulators to yield pre-distorted signal $x_p(t)$ as follows:

$$x_p(t)=Re\{x(t).g(t).exp(j\omega_c t+p(t))\}$$

g) The pre-distorted input $x_p(t)$ is applied to the input of the high power amplifier, whereupon if the LUT coefficients $g(i)$ and $p(i)$ have been set correctly, the output from the power amplifier will emerge with less distortion than if no correction had been employed.

Given the power amplifier RF output waveform $y_c(t)=Re\{y(t).exp(j\omega_c t)\}$, where $y(t)$ is the baseband equivalent complex signal, and also given a target linear RF gain G, the LUT coefficients $g(i)$ and $p(i)$ are set to optimum values by the following adaptation process:

h) A gain error signal $\epsilon_g(t)$ is derived as follows:

$$\epsilon_g(t) = ((|y(t)|/G) - |x(t)|)/(|x(t)|)$$

Subject to the particular implementation of error detector (60), $\epsilon_g(t)$ may be an approximation to the above function and have a restricted linear range or relate simply to the $\epsilon_g$ of the ideal gain error.

i) The gain error signal $\epsilon_g(t)$ is sampled at a rate $f_s$ to yield a sequence $\epsilon_{g,k}$ where $\epsilon_{g,k} = \epsilon_g(k/f_s)$.

j) A phase error signal $\epsilon_p(t)$ is derived as follows:

$$\epsilon_p(t) = \text{angle}(y(t)) - \text{angle}(x(t))$$

Subject to the particular implementation of error detector (60), $\epsilon_g(t)$ may be an approximation to the above function and have a restricted linear range or relate simply to the $\epsilon_g$ of the ideal gain error.

k) The phase error signal Fp(t) is sampled at a rate f, to yield a sequence $\epsilon_{p,k}$ where $\epsilon_{p,k} = \epsilon_p(k/f_s)$.

l) An improved estimate $g'_k$ of each gain correction coefficient $g_k$ is formed as follows:

$$g'_k = g_k - \mu_g \cdot \epsilon_{g,k}$$

m) An improved estimate $p'_k$ of each phase correction coefficient $P_k$ is formed as follows:

$$p'_k = p_k - \mu_p \cdot \epsilon_{p,k}$$

n) The improved estimates $g'_k$ and $p'_k$ are written back into lookup table entry $i_k$.

o) The sample number k is incremented by 1 and the process repeated from step (I).

This assumes no propagation or processing delay in the operations or in the power amplifier. A practical implementation will require certain signals to be delayed in order to remove timing skew, however this does not influence the nature of the algorithm.

Figure 7:
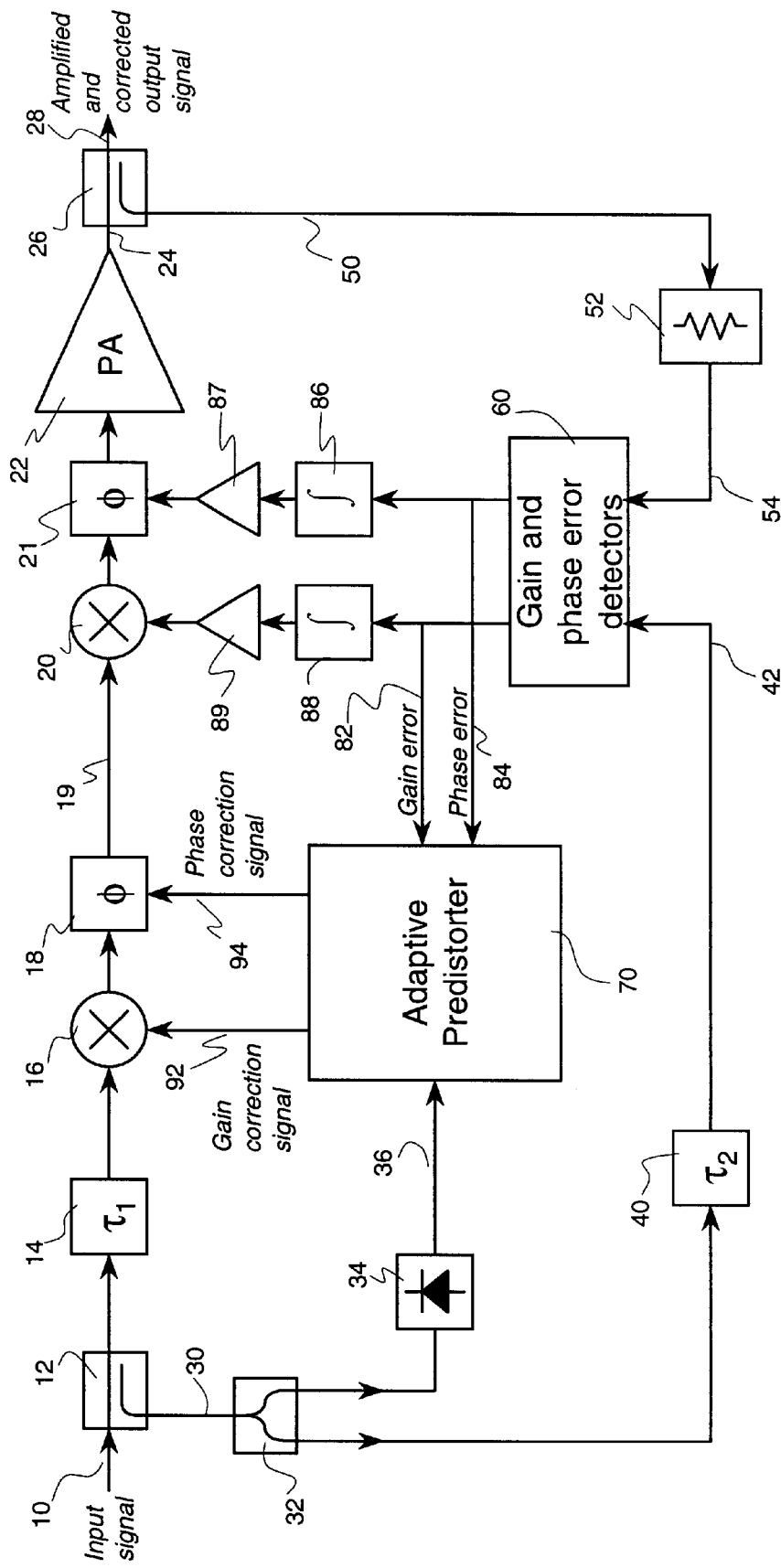
FIG. 7 shows an amplifier arrangement in accordance with a second embodiment of the invention.

FIG. 7 shows a block diagram of the second embodiment of the invention. Wherein the system includes second amplitude (20) and second phase (21) modulators and baseband processing elements (86, 87, 88, 89). These form slow feedback loops operating in the gain and phase domains in order to centre the operation of the pre-distorter and allow system components of greatly reduced operating range to be used.

The operation of the slow gain feedback loop is as follows: the gain error signal (82) is integrated by integrator (88) and amplified by gain block (89). It is then applied to a second amplitude modulator (20) which adjusts the signal level into the second phase modulator (21) and high power amplifier (22). The arrangement forms a control loop with integral action whereby the output level is adjusted to set the sampled output (52) at the same average envelope voltage as the sampled input (42).

Similarly, the operation of the slow phase feedback loop is as follows: the phase error signal (84) is integrated by integrator (86) and amplified by gain block (87). It is then applied to a slow phase modulator (21) which adjusts the phase of the signal into the high power amplifier (22). The arrangement forms a control loop with integral action whereby the average phase of the sampled output (52) is adjusted to the same average phase as the sampled input (42). When slow loops are used, it is required that the correction signal anti-alias filters (714) and (744) have a zero at DC (i.e. are AC coupled) in order to prevent the pre-distorter adaptation and slow loop adjustments interacting.

The sampled RF output from directional coupler (12) is applied to a power splitter (32), the outputs of which are connected to an envelope detector (34) and a delay line (40). The output of the envelope detector is connected to an adaptive pre-distorter subsystem (70). The adaptive pre-distorter subsystem (70) generates two outputs: a gain correction signal (92) which is connected to the control port of first amplitude modulator (16); and a phase correction signal (94) which is connected to the control port of first phase modulator (18). As described in relation to the first embodiment, the pre-distorter (70) adaptively adjusts its gain and phase transfer functions in response to residual gain error (82) and residual phase error (84) signals fed back from an error detection subsystem (60) and the error detection subsystem (60) operates as described above.

The 'slow feedback' control system nulls out the average gain and phase errors in the adaptation loop. The output of the gain error detector mentioned above is integrated and amplified to provide a control signal which modulates a gain control element between the pre-distorter and the power amplifier itself. Similarly, the output of the phase error detector mentioned above is integrated and amplified to provide a control signal which modulates a phase control element between the pre-distorter and the power amplifier. These feedback control loops adjust to trim out the amplitude and phase errors between the two signal paths into the gain and phase error detectors, ensuring that these detectors are operated at their optimum operating point. A further benefit is that with the slow loops controlling the average gain and phase response of the high power amplifier, the range of gain and phase adjustment required from the pre-distorter is greatly reduced.

Previous designs for providing pre-distorted amplification are too complex to be easily realisable in discrete form. The present invention provides a completely polar-domain design which is capable of providing pre-distortion to a standalone radio frequency power amplifier rather than being necessarily being incorporated into an existing DSP system. The analogue signal processing used to condition error signal and provide input signals eliminates the need to accurately digitise wideband signals at the carrier frequency in order to drive DSP implementations of the error feedback system and pre-distorter. The correction signals from the pre-distorter are applied to the input signal via analogue radio frequency control elements whereby at no stage is the input signal to the power amplifier required to be in the digital domain. The use of slow loops can be used to stabilise the power amplifier gain and phase response, thereby reducing the dynamic range required from the pre-distorter lookup table. This is of advantage for many applications such as in the provision of high power linear amplifiers in the transmission of signals in cellular radio base stations.

| Abbreviations and Definition of Terms | |
|---|---|
| 2G | Second Generation (cellular system) |
| 3G | Third Generation (cellular system) |
| AM-AM | Amplitude Modulation-Amplitude Modulation (conversion) |
| AM-PM | Amplitude Modulation-Phase Modulation (conversion) |
| ADC | Analogue-to-Digital Converter |
| DAC | Digital-to-Analogue Converter |
| FIFO | First In First Out |
| GSM | Global System for Mobile (Communications) |

-continued

Abbreviations and Definition of Terms

| | |
|---|---|
| GMSK | Gaussian Minimum Shift Keying |
| LUT | Lookup Table |
| CDMA2000 | A proposed third generation cellular standard |
| WCDMA | A proposed third generation cellular standard |

What is claimed is:

1. A linear power amplifier arrangement comprising a high power amplifier, a pre-distortion circuit and a feedback circuit;

wherein an input is operable to receive radio frequency (RF) input signals to the arrangement and is connected to the power amplifier;

wherein the feedback circuit compares a sample of the power amplifier signal output with a sample of the RF input signal to provide error signals, which error signals are employed to modify a set of look-up values;

wherein the pre-distortion circuit receives a sample of the RF input signal and gain a phase error signals from the feed back circuit; and wherein the pre-distortion circuit determines gain and phase error correction signals relative to the set of look-up values and the sample of the RF input signal, which gain and phase error correction signals are applied to inputs of RF amplitude and phase modulators;

which error correction signals are generated as functions of the RF input signal in such a way that the modulated delayed RF input signal on passing through the high power amplifier emerges with reduced distortion.

2. A linear power amplifier arrangement comprising a high power amplifier, a pre-distortion circuit and a feedback circuit;

wherein an input is operable to receive radio frequency (RF) input signals and is connected to the power amplifier via a directional coupler, a first delay line, an RF amplitude modulator and an RF phase modulator;

wherein the feedback circuit comprises a directional coupler operable to sample an output of the amplifier and provide a signal to an amplitude and phase error detector;

wherein the pre-distortion circuit comprises a coupled line from the input directional coupler, a power gplitter, the outputs of which are connected to a second delay line and an adaptive pre-distortion subsystem;

wherein the second delay line is operable to provide a signal to the amplitude and phase error detector; and wherein the pre-distortion subsystem is operable to receive signals from the power splitter via an RF envelope detector and signals relating to gain error and amplitude error from the phase and amplitude error detector and to provide a gain correction signal to a control port of the amplitude modulator; and a phase correction signal to a control port of the phase modulator, wherein the adaptive pre-distorter is operable to generate the correction signals as functions of a tapped RF input signal in such a way that the modulated delayed RF input signal on passing through the high power amplifier emerges with reduced distortion.

3. An amplifier arrangement according to claim 2 wherein the pre-distorter sub-system determines the correction signals with reference to a look up table.

4. An amplifier arrangement according to claim 2 wherein the first delay line is operable to compensate for any delay skew between the signal modulation and the correction signals induced by processing delay in the correction path.

5. An amplifier arrangement according to claim 2 wherein the feedback circuit further comprises an attenuator which is operable to attenuate a coupled output from directional coupler and provide the signal to the amplitude and phase error detector.

6. An amplifier arrangement according to claim 2, further comprising, in the pre-distortion sub-circuit: an input operable to receive a time-varying output proportional to the varying amplitude envelope of the RF input signal from the envelope generator; an anti-alias filter and analogue-to-digital converter (ADC) signal digitiser, a lookup table (LUT) to determine gain and phase correction coefficients; digital-to-analogue converters (DACs) and anti-alias filters operable to convert these gain and phase correction coefficients to the analogue domain; whereby the sub-circuit can produce continuous-time correction signals.

7. A linear power amplifier arrangement comprising a high power amplifier, a pre-distortion circuit and a feedback circuit;

wherein an input is operable to receive radio frequency (RF) input signals and is connected to the power amplifier via an input directional coupler, a first delay line, a first RF amplitude modulator, a first RF phase modulator, a second RF amplitude modulator and a second RF phase modulator;

wherein the feedback circuit comprises a directional coupler operable to sample an output of the amplifier and provide a signal to an amplitude and phase error detector, baseband processing elements; and second amplitude and phase modulators;

wherein the pre-distortion circuit comprises a coupled line from the input directional coupler, a power splitter, the outputs of which are connected to a second delay line and an adaptive pre-distortion subsystem;

wherein the second delay line is operable to provide a signal to the amplitude and phase error detector; and wherein the pre-distortion subsystem is operable to receive signals from the power splitter via an RF envelope detector and signals relating to gain error and amplitude error from the phase and amplitude error detector and to provide, with reference to a look-up table, a gain correction signal to a control port of the first amplitude modulator; and a phase correction signal to a control port of the first phase modulator;

the baseband processing elements comprise feedback loops operable in the gain and phase domains in order to centre the operation of the pre-distorter;

wherein the adaptive pre-distorter is operable to generate the correction signals as functions of a tapped RF input signal in such a way that the modulated delayed RF input signal on passing through the high power amplifier emerges with reduced distortion.

8. An amplifier arrangement according to claim 7 wherein the first delay line is operable to compensate for any delay skew between the signal modulation and the correction signals induced by processing delay in the correction path.

9. An amplifier arrangement according to claim 7 wherein the feedback circuit further comprises an attenuator which is operable to attenuate a coupled output from directional coupler and provide the signal to the amplitude and phase error detector.

10. An amplifier arrangement according to claim 7, further comprising, in the pre-distortion sub-circuit: an input operable to receive a time-varying output proportional to the varying amplitude envelope of the RF input signal from the envelope generator; an anti-alias filter and analogue-to-digital converter (ADC) signal digitiser, a lookup table (LUT) to determine gain and phase correction coefficients; digital-to-analogue converters (DACS) and anti-alias filters operable to convert these gain and phase correction coefficients to the analogue domain; whereby the sub-circuit can produce continuous-time correction signals.

11. A method of operating a linear power amplifier arrangement comprising a high power amplifier, a pre-distortion circuit and a feedback circuit; comprising the following steps:
  receiving RF input signals at an input connected to the power amplifier via a directional coupler, a first delay line, an RF amplitude modulator and an RF phase modulator;
  in the feedback circuit: coupling output signals from an output of the amplifier employing a directional coupler operable to sample an output of the amplifier and to provide signals to an amplitude and phase error detector;
  in the pre-distortion circuit: coupling a sample of the RF input signal employing a directional coupler, splitting the signal via a power splitter, feeding a first output of which to an amplitude and phase error detector via a second delay line and a second output of which to an adaptive pre-distortion sub-system via an RF envelope detector;
  at the pre-distorter sub-system: receiving sampled RF input signals from the RF envelope detector and signals relating to gain error and amplitude error from the phase and amplitude error detector and providing a gain correction signal to a control port of the RF amplitude modulator; and a phase correction signal to a control port of the RF phase modulator;
  wherein the adaptive pre-distorter is operable to generate the correction signals as functions of a tapped RF input signal in such a way that the modulated delayed RF input signal on passing through the high power amplifier emerges with reduced distortion.

12. A method of operating a linear power amplifier arrangement according to claim 11 wherein the method of providing a gain correction signal to a control port of the amplitude modulator; and a phase correction signal to a control port of the phase modulator comprises the step of referring to a look-up table.

13. A method of operating an amplifier according to claim 11, further comprising, in the pre-distortion sub-circuit, the following steps: receiving a time-varying output proportional to the varying amplitude envelope of the RF input signal from the envelope generator; digitising this signal by an anti-alias filter and analogue-to-digital converter (ADC), determining gain and phase correction coefficients in a lookup table (LUT); converting these gain and phase correction coefficients to the analogue domain by digital-to-analogue converters (DACs) and anti-alias filters; whereby to produce continuous-time correction signals.

14. A method according to claim 13 wherein the LUT adaptively controls the pre-distortion coefficients required, the steps comprising:
  sampling the input and output signals of the system;
  splitting each of the two signals into two, feeding one output into a gain error detector and the other into a phase error detector;
  wherein the gain error detector produces an output approximately proportional to the gain error between the signals, and;
  wherein the phase error detector produces an output approximately proportional to the phase error between the signals digitising the gain and phase error signals by an anti-alias filter and ADC;
  whereby, as the pre-distorter operates, the input envelope samples and gain and phase correction samples are delayed in first-in-first-out (FIFO) buffer memory to align them in timing with the sampled error signals from the gain and phase error detectors;
  multiplying the gain and phase error signals by a fixed fractional convergence parameter and subtracting these signals from the delayed gain and phase correction signals respectively to obtain signals which are an improved estimate of the correction signals;
  passing, sample by sample, the improved gain and phase correction estimates back into the lookup table using the delayed envelope signal to determine the correct addresses, thereby improving the accuracy of the pre-distortion for subsequent signals.

15. A method of operating a linear power amplifier arrangement comprising a high power amplifier, a pre-distortion circuit and a feedback circuit; comprising the following steps:
  receiving input signals at an input connected to the power amplifier via a directional coupler, a first delay line, a first amplitude modulator, a first phase modulator, a second amplitude modulator and a second phase modulator;
  in the feedback circuit: coupling output signals from an output of the amplifier employing a directional coupler operable to sample an output of the amplifier and to provide signals to an amplitude and phase error detector and to second amplitude and phase modulators via baseband processing elements which baseband processing elements comprise feedback loops operable in the gain and phase domains and which centre the operation of the pre-distorter;
  in the pre-distortion circuit: coupling a sample of the input signal employing a directional coupler, splitting the signal via a power splitter, feeding a first output of which to an amplitude and phase error detector via a second delay line and a second output of which to an adaptive pre-distortion sub-system via an envelope detector;
  at the pre-distorter sub-system: receiving sampled input signals from the envelope detector and signals relating to gain error and amplitude error from the phase and amplitude error detector and providing a gain correction signal to a control port of the first amplitude modulator; and a phase correction signal to a control port of the first phase modulator,
  wherein the adaptive pre-distorter is operable to generate the correction signals as functions of a tapped input signal in such a way that the modulated delayed input signal on passing through the high power amplifier emerges with reduced distortion.

16. A method of operating a linear power amplifier arrangement according to claim 15 wherein the method of providing a gain correction signal to a control port of the fast amplitude modulator; and a phase correction signal to a control port of the fast phase modulator comprises the step of referring to a look-up table.

17. A method of operating an amplifier according to claim 15, further comprising, in the pre-distortion sub-circuit, the following steps: receiving a time-varying output proportional to the varying amplitude envelope of the RF input signal from the envelope generator; digitising this signal by an anti-alias filter and analogue-to-digital converter (ADC), determining gain and phase correction coefficients in a lookup table (LUT); converting these gain and phase correction coefficients to the analogue domain by digital-to-analogue converters (DACs) and anti-alias filters; whereby to produce continuous-time correction signals.

18. A method according to claim 17 wherein the LUT adaptively controls the pre-distortion coefficients required, the steps comprising:

sampling the input and output signals of the system;

splitting each of the two signals into two, feeding one output into a gain error detector and the other into a phase error detector;

wherein the gain error detector produces an output approximately proportional to the gain error between the signals, and;

wherein the phase error detector produces an output approximately proportional to the phase error between the signals digitising the gain and phase error signals by an anti-alias filter and ADC;

whereby, as the pre-distorter operates, the input envelope samples and gain and phase correction samples are delayed in first-in-first-out (FIFO) buffer memory to align them in timing with the sampled error signals from the gain and phase error detectors;

multiplying the gain and phase error signals by a fixed fractional convergence parameter and subtracting these signals from the delayed gain and phase correction signals respectively to obtain signals which are an improved estimate of the correction signals;

passing, sample by sample, the improved gain and phase correction estimates back into the lookup table using the delayed envelope signal to determine the correct addresses, thereby improving the accuracy of the pre-distortion for subsequent signals.

19. A cellular radio base station incorporating an amplifier arrangement in accordance with any one of claim 1–10.

20. A linear power amplifier arrangement comprising a high power amplifier, a pre-distortion circuit and a feedback circuit;

wherein an input is operable to receive radio frequency (RF) input signals and is connected to the power amplifier via a directional coupler, a first delay line, an RF amplitude modulator and an RF phase modulator;

wherein the feedback circuit comprises a directional coupler operable to sample an output of the amplifier and provide a signal to an amplitude and phase error detector;

wherein the pre-distortion circuit comprises a coupled line from the input directional coupler, a power splitter, the outputs of which are connected to a second delay line and an adaptive pre-distortion subsystem;

wherein the second delay line is operable to provide a signal to the amplitude and phase error detector; and wherein the adaptive pre-distortion subsystem comprises an input operable to receive a time-varying output from the power splitter proportional to the varying amplitude envelope of the RF input signal from an RF envelope detector, inputs operable to receive signals relating to gain error and amplitude error from the phase and amplitude error detector, an anti-alias filter and analogue-to-digital converter (ADC) signal digitiser, a lookup table (LUT) to determine gain and phase correction coefficients; digital-to-analogue converters (DACs) and anti-alias filters operable to convert these gain and phase correction coefficients to the analogue domain and to provide a continuous-time gain correction signal to a control port of the amplitude modulator; and a continuous-time phage correction signal to a control port of the phase modulator, wherein the adaptive pre-distorter subsystem is operable to generate the continuous-time correction signals as functions of a tapped RF input signal in such a way that the modulated delayed RF input signal on passing through the high power amplifier emerges with reduced distortion.

21. A linear power amplifier arrangement comprising a high power amplifier, a pre-distortion circuit and a feedback circuit;

wherein an input is operable to receive radio frequency (RF) input signals and is connected to the power amplifier via an input directional coupler, a first delay line, a first RF amplitude modulator, a first RF phase modulator, a second RF amplitude modulator and a second RF phase modulator;

wherein the feedback circuit comprises a directional coupler operable to sample an output of the amplifier and provide a signal to an amplitude and phase error detector; baseband processing elements; and second amplitude and phase modulators;

wherein the pre-distortion circuit comprises a coupled line from the input directional coupler, a power splitter, the outputs of which are connected to a second delay line and an adaptive pre-distortion subsystem;

wherein the second delay line is operable to provide a signal to the amplitude and phase error detector; and wherein the adaptive pre-distortion subsystem comprises an input operable to receive a time-varying output from the power splitter proportional to the varying amplitude envelope of the RF input signal from an RF envelope detector, inputs operable to receive signals relating to gain error and amplitude error from the phase and amplitude error detector, an anti-alias filter and analogue-to-digital converter (ADC) signal digitiser, a lookup table (LUT) to determine gain and phase correction coefficients; digital-to-analogue converters (DACs) and anti-alias filters operable to convert these gain and phase correction coefficients to the analogue domain and to provide a continuous-time gain correction signal to a control port of the first amplitude modulator; and a continuous-time phase correction signal to a control port of the first phase modulator, the baseband processing elements comprise feedback loops operable in the gain and phase domains in order to centre the operation of the pre-distorter;

wherein the adaptive pre-distorter subsystem is operable to generate the continuous-time correction signals as functions of a tapped RF input signal in such a way that the modulated delayed RF input signal on passing through the high power amplifier emerges with reduced distortion.

22. A method of operating a linear power amplifier arrangement comprising a high power amplifier, a pre-distortion circuit and a feedback circuit; comprising the following steps:

receiving RF input signals at an input connected to the power amplifier via a directional coupler, a first delay line, an RF amplitude modulator and an RF phase modulator;

in the feedback circuit: coupling output signals from an output of the amplifier employing a directional coupler operable to sample an output of the amplifier and to provide signals to an amplitude and phase error detector;

in the pre-distortion circuit: coupling a sample of the RF input signal employing a directional coupler, splitting the signal via a power splitter, feeding a first output of which to an amplitude and phase error detector via a second delay line and a second output of which to an adaptive pre-distortion sub-system via an RF envelope detector;

at the adaptive pre-distorter sub-system: receiving a time-varying sampled RF signal proportional to the varying amplitude envelope of the RF input signal from the envelope detector, digitising this signal by an anti-alias filter and analogue-to-digital converter (ADC), receiving signals relating to gain error and amplitude error from the phase and amplitude error detector, determining gain and phase correction coefficients in a lookup table (LUT); converting these gain and phase correction coefficients to the analogue domain by digital-to-analogue converters (DACs) and anti-alias filters, and providing a continuous-time gain correction signal to a control port of the RF amplitude modulator; and a continuous-time phase correction signal to a control port of the RF phase modulator;

wherein the adaptive pre-distorter subsystem is operable to generate the continuous-time correction signals as functions of a tapped RF input signal in such a way that the modulated delayed RF input signal on passing through the high power amplifier emerges with reduced distortion.

23. A method according to claim 22 wherein the LUT adaptively controls the pre-distortion coefficients required, the steps comprising:

sampling the input and output signals of the system;

splitting each of the two signals into two, feeding one output into a gain error detector and the other into a phase error detector;

wherein the gain error detector produces an output approximately proportional to the gain error between the signals, and;

wherein the phase error detector produces an output approximately proportional to the phase error between the signals;

digitising the gain and phase error signals by an anti-alias filter and ADC;

whereby, as the pre-distorter operates, the input envelope samples and gain and phase correction samples are delayed in first-in-first-out (FIFO) buffer memory to align them in timing with the sampled error signals from the gain and phase error detectors;

multiplying the gain and phase error signals by a fixed fractional convergence parameter and subtracting these signals from the delayed gain and phase correction signals respectively to obtain signals which are an improved estimate of the correction signals;

passing, sample by sample, the improved gain and phase correction estimates back into the lookup table using the delayed envelope signal to determine the correct addresses, thereby improving the accuracy of the pre-distortion for subsequent signals.

* * * * *